United States Patent [19]

Shibata et al.

[11] Patent Number: 4,689,579

[45] Date of Patent: * Aug. 25, 1987

[54] ANALOG INTEGRATED CIRCUIT

[75] Inventors: Akira Shibata, Katsuta; Kazuo Kondo, Yokohama; Koichi Hirose, Katsuta, all of Japan

[73] Assignee: Hitachi, Ltd., Tokyo, Japan

[*] Notice: The portion of the term of this patent subsequent to Apr. 25, 2003 has been disclaimed.

[21] Appl. No.: 721,132

[22] Filed: Apr. 8, 1985

Related U.S. Application Data

[63] Continuation of Ser. No. 280,208, Jul. 6, 1981, abandoned.

[30] Foreign Application Priority Data

Nov. 7, 1980 [JP] Japan ................................ 55-155922
Nov. 7, 1980 [JP] Japan ................................ 55-155923

[51] Int. Cl.[4] .................... H03F 3/45; H01L 27/02
[52] U.S. Cl. .................................... 330/257; 330/261; 330/306; 330/307; 357/51
[58] Field of Search ............... 330/257, 261, 306, 307; 357/48, 51, 91; 307/455

[56] References Cited

U.S. PATENT DOCUMENTS 3,959,040  5/1976  Robertson .............................. 357/51
4,001,869  1/1977  Brown ................................... 357/51
4,253,107  2/1981  Macdougall ........................... 357/51

FOREIGN PATENT DOCUMENTS 57-80753  5/1982  Japan .................................... 330/307
57-80754  5/1982  Japan .................................... 330/307

OTHER PUBLICATIONS

Kelson et al, IEEE J. of Solid State Circuits, vol. SC 8, No. 6, Dec. 1973, pp. 396-403.
Chanclou et al, IBM Tech. Discl. Bulletin, vol. 22, No. 4, Sep. 1979, pp. 1501-1502.
Marcus, "Sourcebook of Electronic Circuits", McGraw-Hill, N.Y., 1968, p. 196, bottom figure (from Electronics, 39:4, pp. 103-109) showing 702 differential amplifier.
National Semiconductor Linear Databook, 1977, (National Semiconductor, Santa Clara, Calif.), pp. 10-81 and 10-85, LM 733, LM 746.

Primary Examiner—James B. Mullins
Attorney, Agent, or Firm—Antonelli, Terry & Wands

[57] ABSTRACT

A high-density analog integrated circuit having built-in resistor elements formed simultaneously with the formation of the base of transistor is disclosed in which a high-resistance element is formed of an ion-implanted resistor, a low-resistance element is formed of a base-diffused resistor, and a pair of high-resistance elements are connected in such a manner that a difference between a signal current flowing through one of the high-resistance elements and another signal current flowing through the other high-resistance element is outputted, and in which an ion-implanted resistor having a high resistance and a thin film capacitor having a small capacitance make up a built-in time constant circuit, which makes it possible to integrate on one semiconductor chip circuits such as a filter circuit for video signal and an input bias circuit.

13 Claims, 28 Drawing Figures

ANALOG INTEGRATED CIRCUIT

This application is a continuation of application Ser. No. 280,208, filed 7/6/81, and now abandoned.

BACKGROUND OF THE INVENTION

The present invention relates to an analog integrated circuit in which a base-diffused resistor and an ion-implanted resistor are formed on one semiconductor chip.

In a conventional analog integrated circuit, a base-diffused resistor is employed as a resistor element. In this case, two particular problems arise. The first of these is that a resistor element having a high resistance occupies a large area, and the second is that the resistance of a resistor element varies widely and therefore a resistor element for determining a circuit characteristic cannot be included in the integrated circuit (hereinafter referred to as "IC"). Accordingly, in the case where a large scale analog circuit is integrated in one LSI, the size of a semiconductor chip having LSI becomes large on account of the first problem. In other words, when a low resistance is employed to make the semiconductor chip size smaller, power dissipation becomes large. Inversely, when a high resistance is employed to reduce the power dissipation, the size of semiconductor chip becomes large. In the above case, the number of external terminals is increased on the basis of the second problem. In brief, the conventional analog IC has two problems which are difficult to solve.

There has been known a Schottky TTL IC (a digital IC) which employs an ion-implanted resistor to reduce power dissipation. An analog IC has been attempted by RCA on an experimental basis, in which an ion-implanted resistor is locally formed using an additional mask to reduce the chip size.

Now, explanation will be made of a conventional technique, with reference to FIGS. 1A and 1B.

FIGS. 1A and 1B are plan and sectional views for showing the structure of a base-diffused resistor. Referring to FIGS. 1A and 1B, an N-type semiconductor layer 2 is grown on a P-type semiconductor layer 1, and a P-type semiconductor region 3 is formed in the N-type layer 2 through base diffusion techniques. Thus, a resistor element is formed between a pair of electrodes 4A and 4B. The resistance R of the resistor element is given by the following equation:

$$R = \rho_s \times \frac{l}{w} \quad (\Omega) \tag{1}$$

where $\rho_s$ indicates a sheet resistivity.

In the case of a base-diffused resistor, the sheet resistivity $\rho_s$ is in the order of 200Ω, and the resistor element must have at least a width w of about 15 μm when a high dimensional accuracy is required. Accordingly, when a resistance of 10 KΩ is desired, the length l of the resistor element becomes equal to 15×50 μm, and thus an area (on the semiconductor chip) occupied by the resistor element is considerably large.

The resistances of resistors employed in designing an analog circuit range from 100Ω to 20 KΩ. Accordingly, when a large value of sheet resistivity $\rho_s$ is employed, an area occupied by a resistor having a high resistance can be reduced, but it is difficult to form a resistor having a low resistance (for example, 100Ω).

Another problem is that the sheet resistivity $\rho_s$ varies widely. Although the sheet resistivity $\rho_s$ depends upon conditions under which base diffusion is carried out, at least ±20 percent variations in $\rho_s$ are unavoidable at the present level of technique. Accordingly, the resistance of the resistor formed through base diffusion techniques varies in the order of ±20%. It is therefore impossible in most cases to form a resistor for determining a time constant of a base-diffused resistor. For this reason, both of a resistor and a capacitor employed in a time constant circuit, which is important from the standpoint of circuit characteristic, are connected to the LSI from the outside thereof. That is, a large number of external terminals for forming time constant circuits are required.

SUMMARY OF THE INVENTION

An object of the present invention is to provide an analog IC which can solve the above problems of the prior art, and is small in chip size and low in power dissipation.

Another object of the present invention is to provide an analog IC suitable for use in a large scale integrated circuit (hereinafter referred to as "LSI"), which is small in chip size and requires only a reduced number of external terminals, and in which the resistances of built-in resistors or on-chip resistors are relatively uniform.

According to the present invention, in an analog IC having a built-in resistor formed simultaneously with the formation of the base of a transistor, a resistor having a high resistance is formed through ion implantation techniques and a resistor having a low resistance is formed through base diffusion techniques, in order to reduce the chip size of IC and to provide low power dissipation. In more detail, when a great number of ion-implanted resistors are included in an IC, interconnections thereover become very hard to fabricate. Therefore a limited number of ion-implanted resistors are employed.

Further, when an ion-implanted resistor is used as the built-in resistor for determining a time constant, the time constant circuit can be integrated in LSI, and thus the number of external terminals can be reduced.

According to the present invention, the sheet resistivity $\rho_s$ can be made equal to about 100Ω, though a sheet resistivity of about 200Ω has been employed in prior art.

Since an ion-implanted resistor and a base-diffused resistor are independently formed on a semiconductor chip, a desired circuit performance can be obtained by controlling the variations between the resistances of ion-implanted resistors and the variations between the resistances of base-diffused resistors. FIGS. 2A and 2B are plan and sectional views for showing respective structures of ion-implanted and base-diffused resistors formed on a semiconductor chip. Referring to FIGS. 2A and 2B, reference numeral 5 designates a conventional base-diffused resistor, and 6 an ion-implanted resistor. The ion-implanted resistor 6 can be formed in an N-type semiconductor layer 2 in which the base-diffused resistor 5 is also formed. In other words, the ion-implanted resistor 6 is obtained by forming a thin P-type semiconductor layer in the N-type semiconductor layer 2 through ion implantation techniques. The resistance R' of the ion-implanted resistor 6 is given by the following equation:

$$R' = \rho_s' \times \frac{l'}{w'} \tag{2}$$

where $\rho_s'$ indicates a sheet resistivity, $l'$ a length of an ion-implanted resistor, and $w'$ a width thereof.

The sheet resistivity $\rho_s'$ of ion-implanted resistor is determined by the conditions under which ion implantation is performed. The sheet resistivity $\rho_s'$ can be varied within a range from $3\rho_s$ to $10\rho_s$ (where $\rho_s$ indicates the sheet resistivity of the base-diffused resistor).

Accordingly, when the sheet resistivity $\rho_s'$ is made equal to $5\rho_s$, there can be formed an ion-implanted resistor having a high resistance, the area of which is one-fifth of that of a base-diffused resistor having the same resistance. When resistors each having a resistance equal to or more than about 3 KΩ are formed through ion implantation techniques and resistors each having a resistance less than about 3 KΩ are formed through base diffusion techniques, that area on the semiconductor chip which is occupied by these resistors, is greatly reduced.

However, dispersion in resistances of built-in resistors causes a serious problem. In order to maintain both the voltage gain of circuit and the d.c. operating level constant, it is required to make variations or dispersions in the ratio between respective resistances of resistor elements as small as possible. For example, the ratio between the resistances of base-diffused resistors is determined by the dimensional accuracy with respect to the length $l$ and width $w$, and is not affected by variations in sheet resistivity $\rho_s$. Similarly, the ratio between the resistances of ion-implanted resistors is determined by the dimensional accuracy with respect to the length $l'$ and width $w'$, and is not affected by variations in sheet resistivity $\rho_s'$. Accordingly, it is possible to make variations in each of these ratios smaller than 10 percent.

On the other hand, the ratio between respective resistances of a base-diffused resistor and an ion-implanted resistor is affected not only by the dimensional accuracy of each resistor but also by variations in each of $\rho_s$ and $\rho_s'$. The sheet resistivity $\rho_s$ depends upon conditions under which base diffusion is carried out, and the sheet resistivity $\rho_s'$ is determined by various conditions under which ion implantation is made. It is impossible to form the base-diffused resistor and ion-implanted resistor at the same time, and these resistors have to be formed through different processes. Accordingly, it is difficult to make vriations in the ratio $\rho_s/\rho_s'$ less than several tens of percent. Therefore, it is required to form a circuit whose characteristic is not affected by the variations in the ratio $\rho_s/\rho_s'$.

Another feature of an ion-implanted resistor is that the dispersion of the resistances in the fabrication process is a relatively small. This is because the conditions under which ion implantation is carried out, can be readily controlled as compared with the conditions under which base diffusion is perfomed. The variations or dispersions in the resistance of ion-implanted resistors can be readily suppressed within the order of ±10%, and it is possible to suppress the above variations within the order of ±5%. Thus, a time constant circuit including an ion-implanted resistor can exhibit the same performance as a similar circuit including a discrete resistor. When a CR time constant circuit is integrated in LSI, it is difficult to obtain a large time constant, if a base-diffused resistor is employed. When an ion-implanted resistor having the same chip size as the base-diffused resistor is employed, a time constant is obtained which is five times as large as that obtained by the base-diffused resistor. Therefore, it is possible to integrate in LSI all of the active filters used in a video band.

DESCRIPTION OF THE PREFERRED EMBODIMENTS

Now, various embodiments of the present invention will be explained below in detail.

Figure 1A:
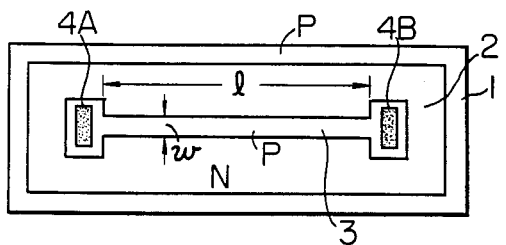
FIGS. 1A and 1B are plan and sectional views for showing the structure of a base-diffused resistor according to prior art, respectively.
Figure 1B:
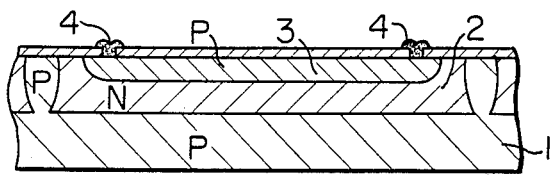
Figure 2A:
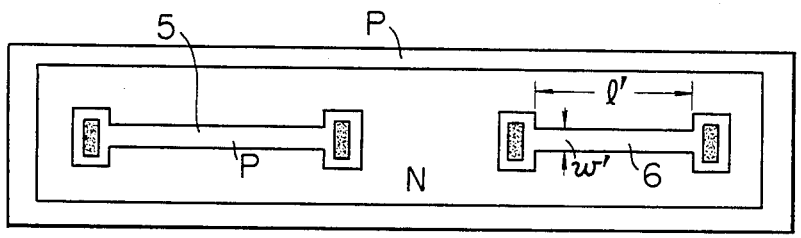
FIGS. 2A and 2B are plan and sectional views for showing the structure of an ion-implanted resistor together with that of a base-diffused resistor, respectively.
Figure 2B:
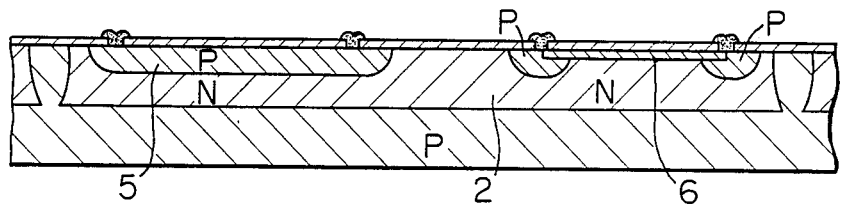
Figure 3:
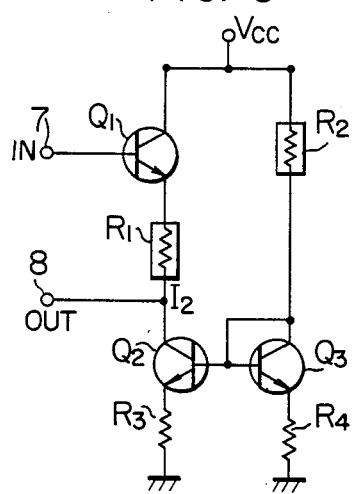
FIG. 3 is a circuit diagram showing an embodiment of a d.c. level shifting circuit according to the present invention.

FIG. 3 shows an embodiment of a d.c. level shifting circuit according to the present invention. A resistor enclosed by a rectangular box indicates an ion-implanted resistor throughout the drawings. Accordingly, each of resistors $R_1$ and $R_2$ shown in FIG. 3 is an ion-implanted resistor. Referring to FIG. 3, owing to the constant-current effect of a transistor $Q_2$, an a.c.

input signal applied through an input terminal 7 to the base of a transistor $Q_1$ is outputted from an output terminal 8 after it has been shifted in d.c. potential, without being subjected to attenuation. The collector current $I_2$ of the transistor $Q_2$ is given by the following equation:

$$I_2 = \frac{V_{cc} - V_{bc}}{R_2 + R_4} \times \frac{R_4}{R_3}. \tag{3}$$

Accordingly, a change (or shift) V in d.c. level due to the resistor $R_1$ is given by the following equation:

$$V = R_1 \times I_2 = (V_{cc} - V_{bc}) \times \frac{R_1}{R_2 + R_4} \times \frac{R_4}{R_3} \tag{4}$$

When $R_2 >> R_4$ (for example, $R_2 > 5R_4$), the change V is expressed approximately by the following formula:

$$V \cong (V_{cc} - V_{be}) \times \frac{R_1}{R_2} \times \frac{R_4}{R_3}$$

As is apparent from the above formula, the change V in d.c. level is determined by the ratios $R_1/R_2$ and $R_4/R_3$. Since, as shown in FIG. 3, each of the resistors $R_1$ and $R_2$ is formed of an ion-implanted resistor and each of the resistors $R_3$ and $R_4$ is formed of a base-diffused resistor, it is possible to make variations in level change V sufficiently small. Referring to a direct current determining circuit made up of a transistor $Q_3$ and the resistors $R_2$ and $R_4$, a voltage $V_{cc}$ is made much higher than a voltage $V_{be}$ and the ratio $R_2/R_4$ is made large so that a current flowing through the transistor $Q_3$ may be substantially determined by the ion-implanted resistor $R_2$. The resistor $R_1$ for shifting the d.c. level is formed of an ion-implanted resistor.

Figure 4:
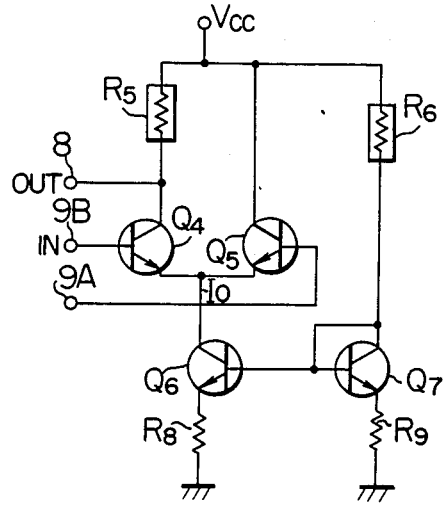
FIG. 4 is a circuit diagram showing an embodiment of a differential amplifier according to the present invention.

FIG. 4 shows an embodiment of a differential amplifier according to the present invention. Referring to FIG. 4, an input terminal 9A is connected to the base of a transistor $Q_5$, and another terminal 9B for differential input is connected to the base of a transistor $Q_4$, the collector of which is connected to an output terminal 8. The voltage gain A of this differential amplifier is given by the following equations:

$$A = g_m R_5 \tag{5}$$

$$g_m = \frac{q}{4kT} I_o \tag{6}$$

$$I_o = \frac{V_{cc} - V_{be}}{R_6 + R_9} \times \frac{R_9}{R_8} \tag{7}$$

$$A = \frac{q}{4kT} \times (V_{cc} - V_{be}) \times \frac{R_5}{R_6 + R_9} \times \frac{R_9}{R_8} \tag{8}$$

where $I_o$ indicates a collector current of transistor $Q_6$, q the electric charge, k the Boltzmann's constant, and T a Kelvin temperature.

When $R_6 >> R_9$, the voltage gain A is given by the following formula:

$$A \cong \frac{q}{4kT} (V_{cc} - V_{be}) \frac{R_5}{R_6} \times \frac{R_9}{R_8} \tag{9}$$

As shown in FIG. 4, each of the resistors $R_5$ and $R_6$ is formed of an ion-implanted resistor and each of the resistors $R_8$ and $R_9$ is formed of a base-diffused resistor. Accordingly, variations in the ratio $R_5/R_6$ and variations in the ratio $R_9/R_8$ may be made sufficiently small, and therefore variations in voltage gain A may be reduced to less than 10 percent.

Now, in order to compare the present invention with the prior art, let us consider the case where all of the resistors shown in FIG. 4 are formed through base diffusion techniques, under conditions that a supply voltage $V_{cc}$ of 12 V is given, a voltage gain A of 25 is required, and a band width (for video signal) of 4 MHz is needed. The resistance of the load resistor $R_5$ is usually made equal to about 3 K$\Omega$, taking into consideration the dimensional accuracy and the area occupied by the resistor $R_5$. Though it is desired to make the resistance of the resistor $R_6$ as high as possible for the purpose of reducing power dissipation, the resistance of the resistor $R_6$ is made equal to 11 K$\Omega$, taking into consideration the area occupied by the resistor $R_6$. The resistance of each of the resistors $R_9$ and $R_8$ is made equal to 300$\Omega$ from a similar point of view. Accordingly, a total current becomes equal to 2.0 mA.

On the other hand, according to the present invention, the load resistor $R_5$ (having a resistance of 15 K$\Omega$) and the resistor $R_6$ (having a resistance of 55 K$\Omega$) are formed through ion implantation techniques, and the resistors $R_8$ and $R_9$ (each having a resistance of 1.5 K$\Omega$) are formed through base diffusion techniques. Accordingly, a total current becomes equal to 0.4 mA, that is, is one-fifth of the value obtained by the prior art, and moreover the area occupied by these resistors is nearly equal to that according to the prior art. In more detail, each of the resistors $R_5$ and $R_6$ has the same shape in both of the present invention and prior art. Each of the resistor $R_8$ and $R_9$ is different in shape between the present invention and the prior art, but occupies the same area in both of the present invention and prior art. This is because, when a base-diffused resistor having a resistance of 300$\Omega$ is formed on the basis of a sheet resistivity of 200$\Omega$, it is required to make the width w of the resistor equal to 30 to 45 $\mu$m, which is two or three times as large as an ordinary value, to obtain a desired accuracy.

In the case where the circuit shown in FIG. 4 is formed of a discrete circuit, the resistance of the load resistor is restricted by the band width. In the integrated circuit having the circuit configuration shown in FIG. 4, since the parasitic capacity has a small capacitance of about 1 pF, a band width of 10 MHz is obtained within a 3 dB reduction even when the load resistor $R_5$ having a resistance of 15 K$\Omega$ is employed. The parasitic capacity having a capacitance of 1 pF includes a capacity between the collector of a transistor $Q_4$ and ground, and a capacity between the resistor $R_5$ and ground. The capacity between the resistor $R_5$ and ground increases in accordance with the area occupied by the resistor $R_5$. Accordingly, if the load resistor $R_5$ is formed of a base-diffused resistor having a resistance of 15 K$\Omega$, the capacity between the resistor 5 and ground is greatly increased, and therefore it becomes difficult to obtain a band width of 10 MHz. The used of ion-implanted resistor for the load resistor 5 produces the advantages that power dissipation is reduced and band width is expanded.

As explained above, according to the embodiment shown in FIG. 4, power dissipation can be reduced to one-fifth of that in the prior art, when the size of semiconductor chip, variations in voltage gain, variations in d.c. level, and the band-width characteristic are made equal to those in the prior art.

Figure 5:
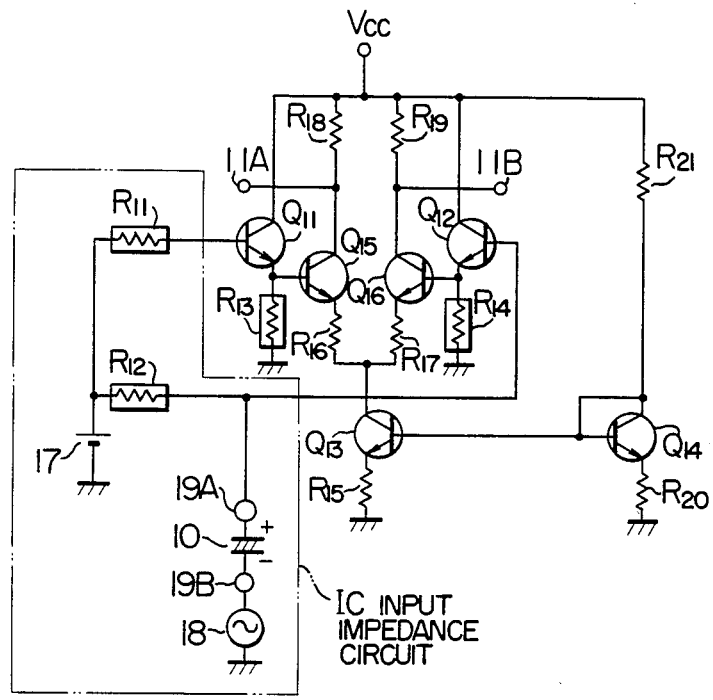
FIGS. 5 and 6 are circuit diagrams showing two embodiments of an input coupler according to the present invention.

FIG. 5 shows an embodiment of an input coupler according to the present invention. Although the impedance of an analog IC may be of the order of megaohms, the total impedance of the analog IC is, in fact, determined by the impedance of a bias current supply. In the embodiment of FIG. 5, it is intended to reduce the capacitance of an external capacitor by using an ion-implanted resistor as the input impedance. That is, the embodiment shown in FIG. 5 aims at reducing the capacitance of an input coupling capacitor 10, which is connected through an external terminal 19B to an a.c. input signal source 18, and at forming the capacitor 10 on the semiconductor chip. In more detail, an input capacitor of a conventional amplifier for amplifying an audio or video signal is required to have a capacitance of several tens of microfarads, and therefore formed of a large-sized electrolytic capacitor. The above input capacitor cannot be mounted on a thick-film IC, and therefore is placed on the outside thereof. In the embodiment shown in FIG. 5, each of input resistors $R_{11}$ and $R_{12}$ connected to a bias voltage supply circuit 17 is formed of an ion-implanted resistor to have a resistance five times as high as that of a conventional input resistor. Thus, the capacitance of the input coupling capacitor can be reduced to one-fifth of that of the conventional capacitor. Incidentally, the bias voltage supply circuit 17 may be included in the analog IC or may be formed of an external power source. When the input impedance of a circuit is enhanced, the frequency characteristic of the circuit is deteriorated due to the Miller effect, and the circuit characteristic is readily affected by variations in d.c. current gain $h_{FE}$. In the embodiment shown in FIG. 5, however, the above-mentioned difficulties are solved by driving a differential amplifier made up of transistors $Q_{15}$ and $Q_{16}$ by emitter-follower transistors $Q_{11}$ and $Q_{12}$. The outputs of the differential amplifier are taken out from output terminals 11A and 11B connected respectively to the collector of the transistor $Q_{15}$ and the collector of the transistor $Q_{16}$.

Referring to FIG. 5, it is desirable to form each of resistors $R_{15}$, $R_{20}$, $R_{16}$ and $R_{17}$ of a base-diffused resistor, since these resistors have a low resistance. When each of the emitter resistors $R_{16}$ and $R_{17}$ is formed of a base-diffused resistor, each of load resistors $R_{18}$ and $R_{19}$ is required to be formed of a base-diffused resistor in order to suppress variations in voltage gain. When each of the load resistors $R_{18}$ and $R_{19}$ is formed of a base-diffused resistor, a resistor 21 must be formed of a base-diffused resistor to maintain constant the d.c. operating voltage of each of the transistors $Q_{15}$ and $Q_{16}$. Further, it is desirable to form each of emitter resistors $R_{13}$ and $R_{14}$ (of the emitter-follower transistors $Q_{11}$ and $Q_{12}$) of an ion-implanted resistor for the purpose of making small the size of semiconductor chip and reducing power dissipation.

Figure 6:
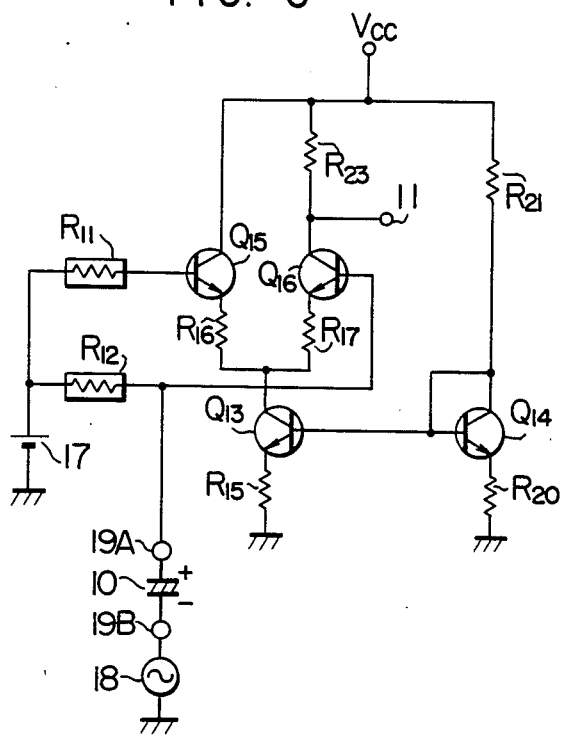

FIG. 6 shows another embodiment of an input coupler according to the present invention, which delivers only an output signal 180° out of phase with an input signal and aims at the same effect as the embodiment shown in FIG. 5.

In the embodiment shown in FIG. 6, in order to suppress the Miller effect, no load resistor is connected to the collector of a transistor $Q_{15}$ having a high base impedance, and a load resistor $R_{23}$ is connected to the collector of a transistor $Q_{16}$, the base of which is connected to a signal source having a low source impedance.

Further, in order to remove the adverse effect of variations in d.c. current gain $h_{FE}$ of each of the transistors $Q_{15}$ and $Q_{16}$, a differential amplifier configuration is formed, and therefore in-phase inputs does not get any gain from the transistors $Q_{15}$ and $Q_{16}$.

In FIGS. 5 and 6, a high-pass filter having a time constant can be formed by the capacitor 10 and resistor $R_{12}$. In this case, the fact that variations in the resistance of the ion-implanted resistor $R_{12}$ are restricted in a narrow range is advantageous.

Next, explanation will be made of cases where the present invention is applied to active filters.

Filters used in the video band can be integrated in an IC by making use of the fact that an ion-implanted resistor has a high resistance and moreover variations in resistance are restricted in a narrow range. An active filter can be formed in IC by using a combination of an ion-implanted resistor and a capacitor.

Figure 7:
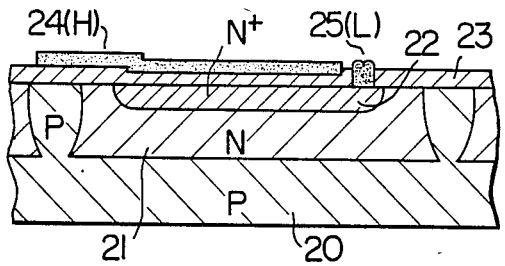
FIG. 7 is a sectional view showing the structure of a thin film capacitor.
Figure 8:
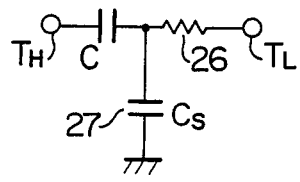
FIG. 8 shows an equivalent circuit of the thin film capacitor shown in FIG. 7.

FIG. 7 is a sectional view shwoing the structure of a thin film capacitor included in an LSI, and FIG. 8 shows an equivalent circuit of the capacitor shown in FIG. 7. Referring to FIG. 8, an input signal is applied to an input terminal $T_L$ (on the low-impedance side) in ordinary cases, to exclude the influences of a parasitic capacitance $C_s$.

Referring to FIG. 7, an N-type semiconductor layer 21 including therein an N+buried layer 22 is used as a lower electrode L, and an Al evaporated film 24 is used an an upper electrode H. Further, an $SiO_2$ film 23 serves as a dielectric. The PN junction formed between a P-type semiconductor layer 20 and the N-type semiconductor layer 21 has a relatively large capacitance. Since the P-type semiconductor layer 20 is grounded, the PN junction forms a parasitic capacitance $C_s$ between the lower electrode L and ground, as shown in FIG. 8. The capacitance of the parasitic capacitance $C_s$ is comparable to the capacitance of the capacitor C, and therefore special consideration has to be given to the parasitic capacitance $C_s$. The N+buried layer 22 is provided to decrease an equivalent resistance 26 shown in FIG. 8 to several tens of ohms or less.

Figure 9:
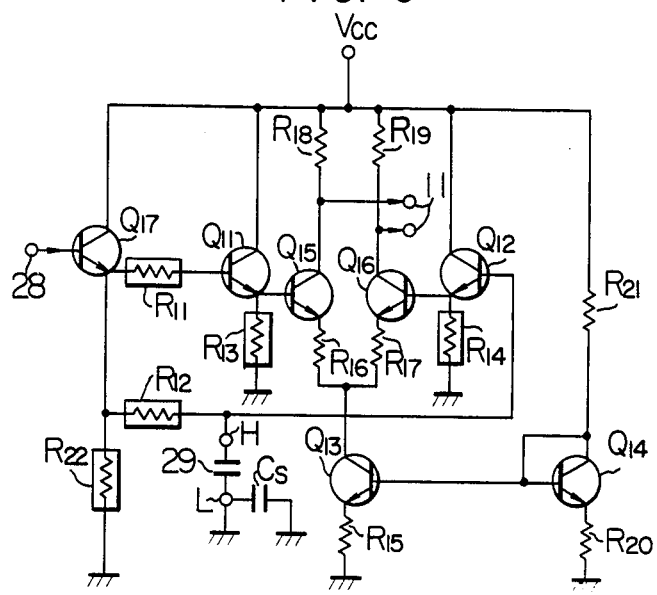
FIG. 9 is a circuit diagram showing an embodiment of a primary high-pass filter according to the present invention.

FIG. 9 shows an embodiment of a primary high-pass filter according to the present invention. Referring to FIG. 9, an input terminal 28 is applied with an a.c. signal containing a d.c. bias component, an ion-implanted resistor $R_{12}$ and a capacitor 29 form a low-pass filter, and the low-pass filter and a differential amplifier including transistors $Q_{15}$ and $Q_{16}$ form a high-pass filter.

The capacitor 29 is formed of such a thin film capacitor as shown in FIGS. 7 and 8. The upper electrode H of the capacitor 29 is connected to a resistor $R_{12}$, and the lower electrode L is grounded. In order to reduce the size of a semiconductor chip including therein an LSI, it is desirable to make the capacitance of the capacitor 29 as small as possible. For example, when a high-pass filter having a minimum frequency of 1 MHz is formed, the capacitance of the capacitor 29 and the resistance of the ion-implanted resistor $R_{12}$ are made equal to 5pF and 33 KΩ, respectively.

According to the conventional method in which the resistor $R_{12}$ is formed of a base-diffused resistor, the capacitance of the capacitor 29 and the resistance of the resistor 12 must be made equal to 10pF and 16 KΩ, respectively, from the practical point of view. That is, the area occupied by the capacitor 29 is twice as large as that according to the present invention. Further, in this case, the resistance of the resistor 12 varies between ±20% and ±30%, according to the fabrication process and therefore it is impossible to control the time constant of this CR circuit. According to the embodiment shown in FIG. 9, variations in the capacitance of capacitor 29 are restricted between −5% and +5%, and variations in the resistance of the ion-implanted resistor 12 are also restricted between −5% and +5%. Emitter-follower transistors $Q_{11}$ and $Q_{12}$ shown in FIG. 9 are provided to attain the same effect as the transistors $Q_{11}$ and $Q_{12}$ shown in FIG. 5. The capacitor 29 is employed in such a manner as excluding the influences of the parasitic capacitance $C_s$ because the parasitic capacitance $C_s$ is a junction capacitance and readily varies depending upon the process conditions. In the case where the time constant of the high-pass filter is required to be variable, the base terminal of the transistor $Q_{12}$ is so provided as to form an external terminal, and the external capacitor 29 is connected to the external terminal. When the circuit configuration shown in FIG. 9 is formed without employing any ion-implanted resistor, each of the capacitor 29 and resistor $R_{12}$ is required to be formed of an external element, and therefore two external terminals are needed. According to this aspect of the present invention, the number of external terminals is reduced by one or two, as compared with the case where the ion-implanted resistors are not used.

Figure 10:
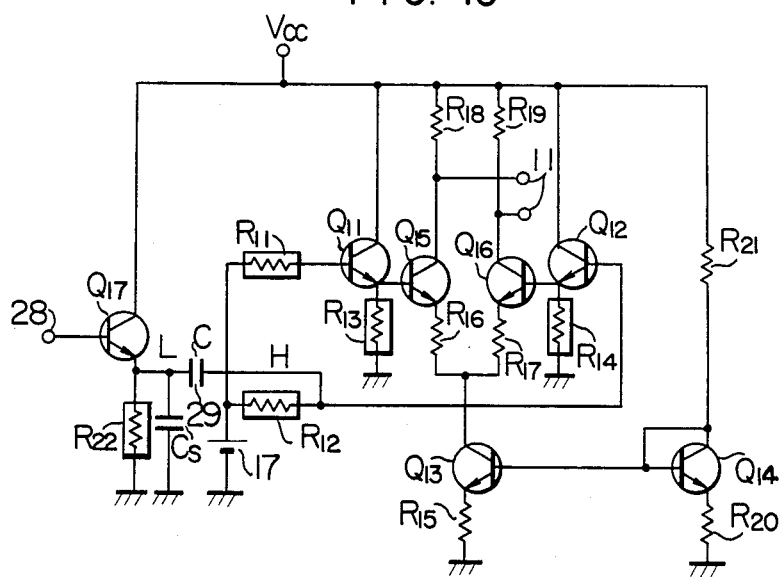
FIG. 10 is a circuit diagram showing an embodiment of a primary low-pass filter according to the present invention.

FIG. 10 shows an embodiment of a primary low-pass filter according to the present invention. Referring to FIG. 10, a capacitor 29 and an ion-implanted resistor $R_{12}$ form a high-pass filter, which is converted into a low-pass filter by a differential amplifier including transistors $Q_{15}$ and $Q_{16}$. A d.c. bias voltage is supplied from a d.c. supply source 17 through ion-implanted resistors $R_{11}$ and $R_{12}$ to transistors. An input signal applied to an input terminal 28 is subjected to impedance conversion by an emitter-follower transistor $Q_{17}$, and then applied to the capacitor 29. The upper electrode H and lower electrode L of the capacitor 29 are connected respectively to the resistor $R_{12}$ and the emitter of the transistor $Q_{17}$, to eliminate the influences of the parasitic capacitance $C_s$.

Figure 11:
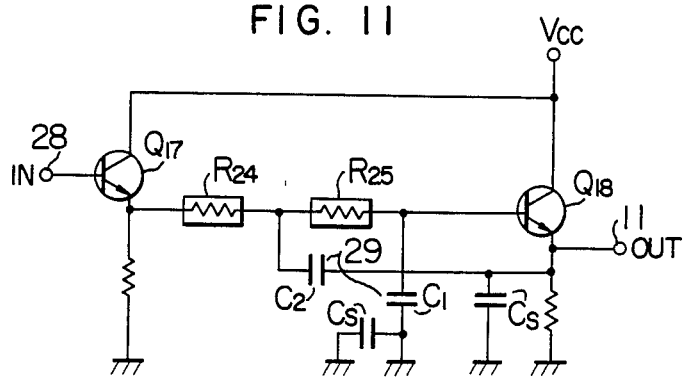
FIGS. 11 and 12 are circuit diagrams showing two embodiments of a secondary low-pass filter according to the present invention.
Figure 12:
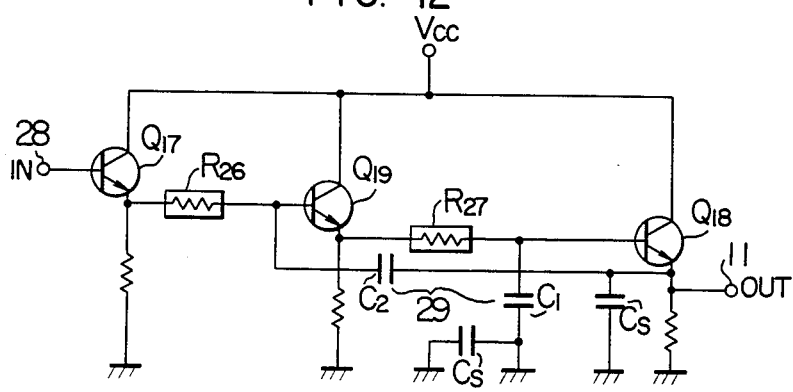

FIGS. 11 and 12 show embodiments of a secondary low-pass filter according to the present invention. The embodiment shown in FIG. 11 is obtained by converting a well-known discrete circuit into a circuit suitable for use in an LSI. The transfer function $H(j\omega)$ of the embodiment shown in FIG. 11 is given by the following equations:

$$H(j\omega) = \frac{\omega_o^2}{(j\omega)^2 + \frac{\omega_o}{Q} \times j\omega + \omega_o^2} \quad (10)$$

$$\omega_o = \frac{1}{R_o \sqrt{C_1 C_2}}, Q = \frac{1}{2}\sqrt{\frac{C_2}{C_1}}, R_o = R_{24} = R_{25}$$

where $\omega_o$ indicates a corner frequency, and Q a peaking characteristic at the corner (namely, the break point).

Referring to FIG. 11, each of resistors $R_{24}$ and $R_{25}$ for determining a time constant is formed of an ion-implanted resistor, and each of two capacitors $C_1$ and $C_2$ is formed of a thin film capacitor. In order to eliminate the adverse effect of the paracitic capacitance $C_s$ resulting from the thin film capacitors $C_1$ and $C_2$, the lower electrode of the capacitor $C_1$ is grounded, and the lower electrode of the capacitor $C_2$ is connected to the emitter of an emitter-follower transistor $Q_{18}$.

When a low-pass filter having a corner frequency $\omega_o = 2\pi$ (MHz) and a Q value of 1 is formed, the capacitance of the capacitor $C_1$, that of the capacitor $C_2$, and the resistance of each of the resistors $R_{24}$ and $R_{25}$ are made equal to 5pF, 20pF, and 16 KΩ, respectively. When the capacitance of the capacitor $C_1$ is made too small, the circuit characteristic is readily affected by the input capacity of the transistor $Q_{18}$ and other stray capacitance. Accordingly, the capacitor $C_1$ is required to have a capacitance more than or equal to 5pF. When the capacitance of the capacitor $C_1$ is made equal to 5pF, the capacitor $C_2$ must have a capacitance of 20pF to maintain the peaking characteristic having a Q value of 1.

FIG. 12 shows another embodiment of a secondary low-pass filter according to the present invention. The embodiment shown in FIG. 12 differs from that shown in FIG. 11 only in that an emitter-follower transistor $Q_{19}$ is additionally provided. The transfer function of the embodiment shown in FIG. 12 is expressed by the equation (10), in which $$\omega_o = \frac{1}{R_o \sqrt{C_1 C_2}}, Q = \sqrt{\frac{C_2}{C_1}}.$$

$R_o = R_{26} = R_{27}$. That is, when the transistor $Q_{19}$ is used, the corner frequency $\omega_o$ is kept unchanged, but the value of Q is doubled. Accordingly, when a low-pass filter having a corner frequency $\omega_o$ of $2\pi$ MHz and a Q value of 1 is formed, the capacitance of the capacitor $C_1$, that of the capacitor $C_2$, and the resistance of each of the resistors $R_{26}$ and $R_{27}$ can be made equal to 5pF, 5pF, and 33 Kω, respectively. Though the capacitor $C_2$ shown in FIG. 11 is required to have a capacitance of 20pF, the capacitor $C_2$ shown in FIG. 12 has a capacitance of only 5pF. When a capacitor is included in an LSI, the size of a semiconductor chip having therein the LSI is advantageously reduced by decreasing the capacitance of the capacitor from 20pF to 5pF. In the embodiments of FIGS. 11 and 12, respective resistances of the resistors $R_{24}$ and $R_{25}$ for determining a time constant are made equal to each other in order to simplify the transfer function. However, the resistors $R_{24}$ and $R_{25}$ are not required to have the same resistance, but each resistor may have an appropriate resistance.

Figure 13:
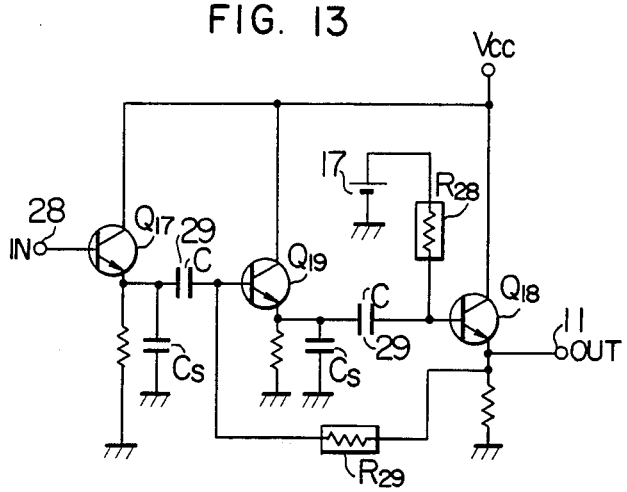
FIG. 13 is a circuit diagram showing an embodiment of a secondary high-pass filter according to the present invention.

FIG. 13 shows an embodiment of a secondary high-pass filter according to the present invention. In order that the circuit configuration of FIG. 13 can be integrated in an LSI, each of resistors $R_{28}$ and $R_{29}$ for determining a time constant is formed of an ion-implanted resistor, each of two capacitors for determining the time constant is formed of a thin film capacitor, and emitter-follower transistors $Q_{17}$ and $Q_{19}$ are provided to be immune to the adverse effect of the paracitic capacitance resulting from the thin film capacitors. The transfer function (from an input terminal 28 to an output terminal 11) of the embodiment shown in FIG. 13 is given by the following equations:

$$H(j\omega) = \frac{(j\omega)^2}{(j\omega)^2 + \frac{\omega_o}{Q}(j\omega) + \omega_o^2} \quad (11)$$

$$\omega_o = \frac{1}{C\sqrt{R_{28}R_{29}}}, \quad Q = \sqrt{\frac{R_{29}}{R_{28}}}$$

Accordingly, a high-pass filter having a corner frequency $\omega_o$ of $2\pi$ MHz and a Q value of 1 can be formed by employing the resistors $R_{28}$ and $R_{29}$ each having a resistance of 33 K$\Omega$ and two thin film capacitors each having a capacitance of 5pF. It is to be noted that, in the embodiment shown in FIG. 13, respective capacitances of two thin film capacitors are made equal to each other in order to simplify the transfer function, just as the resistors $R_{24}$ and $R_{25}$ shown in FIG. 11 have the same resistance.

As is apparent from the foregoing explanation, the present invention has the following advantages.

(a) The capacitance of a capacitor for coupling an input signal to an LSI can be reduced to a fraction of that of a conventional capacitor. Thus, an input circuit is made small-sized, and the peripheral circuit of LSI can be formed of a thick film IC.

(b) A time constant circuit requiring a high accuracy can be integrated in an LSI, and therefore both the number of peripheral parts and the number of external terminals are reduced.

(c) A secondary active filter according to the present invention occupies that area on a semiconductor chip which is a fraction of the area occupied by a conventional filter.

Now, explanation will be made of a non-linear emphasis IC for home video tape recorders, in which an ion-implanted resistor is employed.

An ordinary emphasis circuit has a fixed frequency characteristic independently of input signal level. On the other hand, in a non-linear emphasis circuit, the frequency characteristic varies with the input signal level in the following manner. That is, the circuit does not perform emphasis operation when the input signal level is high, and the degree of emphasis is large as the input signal level is lower. Such a non-linear emphasis circuit has been hitherto formed of a discrete circuit.

In a home video tape recorder, a video signal to be recorded is applied to the non-linear emphasis circuit and ordinary emphasis circuit to emphasize a high-frequency component of the video signal by these emphasis circuits, and then stored in a magnetic tape. When the video signal is reproduced, the stored signal is applied to a non-liner de-emphasis circuit and an ordinary de-emphasis circuit to restore the emphasized high-frequency component to the initial state, therely improving the signal-to-noise ratio.

Figure 14:
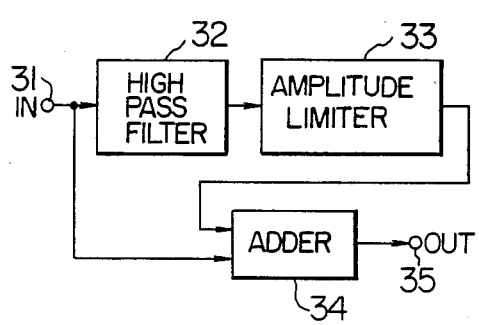
FIG. 14 is a block diagram showing a non-linear emphasis circuit suitable for use in an IC.

A non-linear emphasis circuit employed in the IC according to the present invention, as shown in FIG. 14, is made up of an input terminal 31 for video signal, a high-pass filter 32, an amplitude limiter 33, an adder 34, and an output terminal 35. The input terminal 31 is applied with a video signal, a high-frequency component of which is extracted by the high-pass filter 32. The amplitude of the extracted component is clamped or clipped by the amplitude limiter 33 so as to become approximately uniform. The output of the amplitude limiter 33 is added by the adder 34 to the video signal from the input terminal 31. Thus, a non-linearly emphasized signal is delivered from the output terminal 35. The circuit shown in FIG. 14 is disclosed in a pending U.S. application Ser. No. 297,811, now U.S. Pat. No. 4,451,746 based on Japanese Patent Application No. 90528/55 dated July 4, 1980, assigned to the present assignee.

Figure 15:
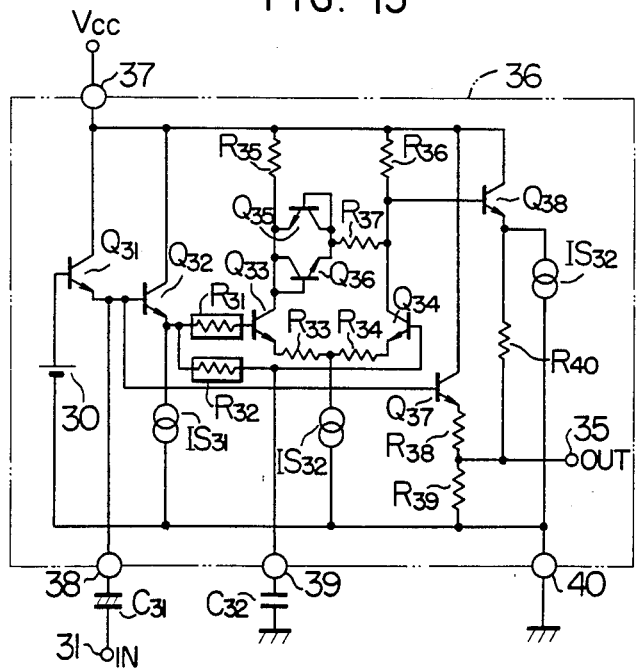
FIG. 15 is a circuit diagram showing an embodiment of the non-linear circuit shown in FIG. 14, in which ion-implanted resistors are employed according to the present invention.

FIG. 15 shows an embodiment of a non-linear emphasis IC according to the present invention. In FIG. 15, reference numeral 36 designates an IC, and 37 to 40 external terminals for the IC. In more detail, an area enclosed by a dotted line indicates the internal circuit of IC, and the terminals 37 and 40 are a power supply terminal and a ground terminal, respectively. Further, in FIG. 15, reference numeral 31 designates a video signal input terminal, $C_{31}$ a clamping capacitor, 38 a clamp terminal, $Q_{31}$ a clamping transistor, 30 a bias voltage source, $IS_{31}$ to $IS_{33}$ constant-current supply sources, $Q_{32}$, $Q_{37}$ and $Q_{38}$ buffer transistors, $Q_{33}$ and $Q_{34}$ transistors for making up a differential amplifier, $Q_{35}$ and $Q_{36}$ diode-connected transistors, $C_{32}$ a filtering capacitor, $R_{31}$ and $R_{32}$ ion-implanted resistors, and $R_{33}$ to $R_{40}$ base-diffused resistors.

Referring to FIG. 15, a video signal applied to the input terminal 31 is supplied to the IC 36 through the clamping capacitor 31 and terminal 38. The sync. tip potential of the applied video signal is fixed by the clamping transistor $Q_{31}$ to a value $(V_1 - V_{BE1})$, where $V_1$ indicates the voltage of the bias voltage source 30, and $V_{BE1}$ the base-emitter voltage of the transistor $Q_{31}$). The video signal, whose sync. tip potential is fixed, is supplied to respective bases of the buffer transistors $Q_{37}$ and $Q_{32}$. The output signal from the emitter of the transistor $Q_{32}$ is supplied through the ion-implanted resistor $R_{31}$ to the base of the transistor $Q_{33}$, and also supplied through the ion-implanted resistor $R_{32}$ to the base of the transistor $Q_{34}$. The base of the transistor $Q_{34}$ is connected to the terminal 39, which is connected through the capacitor 32 to ground. The resistors $R_{33}$ and $R_{34}$ are series-connected between the emitter of the transistor $Q_{33}$ and the emitter of the transistor $Q_{34}$. The constant-current supply source $IS_{32}$ is connected between the junction of the resistors $R_{33}$ and $R_{34}$ and ground. The collector of the transistor $Q_{33}$ is connected through the resistor $R_{35}$ to the power supply terminal 37, and the collector of the transistor $Q_{34}$ is connected through the resistor $R_{36}$ to the terminal 37. Further, the resistor $R_{37}$ and a parallel circuit, which is formed of diode-connected transistors $Q_{35}$ and $Q_{36}$ connected in the opposite sense, are series-connected between the collector of the transistor $Q_{33}$ and the collector of the transistor $Q_{34}$.

The transistors $Q_{33}$ and $Q_{34}$ form a differential amplifier for amplifying a difference signal between an input signal applied to the base of $Q_{33}$ and another input signal applied to the base of $Q_{34}$. The resistors $R_{31}$ and $R_{32}$ connected to respective bases of the transistors $Q_{33}$ and $Q_{34}$ are selected so as to have the same resistance. Similarly, the resistors $R_{33}$ and $R_{34}$ connected to respective emitters of $Q_{33}$ and $Q_{34}$ are selected so as to have the same resistance, and the resistors $R_{35}$ and $R_{36}$ connected to respective collectors of $Q_{33}$ and $Q_{34}$ are selected so as to have the same resistance. A series circuit formed of the resistor $R_{37}$ and the parallel circuit including diode-connected transistors $Q_{35}$ and $Q_{36}$ forms an amplitude limiter for limiting the amplitude of the output signal from the differential amplifier.

Since the output signal from the buffer transistor $Q_{32}$ is supplied through the resistor $R_{31}$ to the base of the transistor $Q_{33}$, the input signal of the transistor $Q_{33}$ has no frequency characteristic. On the other hand, the base of the transistor $Q_{34}$ receives the input signal thereof through a low-pass filter formed of the resistor $R_{32}$ and the capacitor $C_{32}$. Accordingly, an input signal applied to the differential amplifier formed of the transistors $Q_{33}$ and $Q_{34}$ has a high-pass filter characteristic. The frequency characteristic of a high-pass filter thus formed is given by the following equation:

$$\frac{V_o}{V_i} = \frac{j\omega C_{32} R_{32}}{1 + j\omega C_{32} R_{32}} \quad (12)$$

where $V_i$ indicates an input signal voltage, and $V_o$ an output signal voltage. The output of the differential amplifier is supplied to the base of the transistor $Q_{38}$. The signal outputted from the emitter of the transistor $Q_{38}$ is added through the resistor $R_{40}$ to a signal, which is obtained by supplying the base of the buffer transistor $Q_{37}$ with the video signal from the emitter of the buffer transistor $Q_{31}$ and by dividing the signal outputted from the emitter of the buffer transistor $Q_{37}$ by the resistors $R_{38}$ and $R_{39}$. An output signal thus added is delivered from the output terminal 35.

Figure 16A:
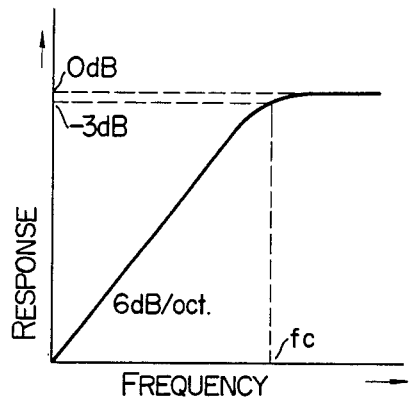
FIGS. 16A to 16D are characteristic diagrams for explaining the operation of the embodiment shown in FIG. 15.

The frequency characteristic of the high-pass filter given by equation (12) is shown in FIG. 16A, and the cutoff frequency $f_c$ of the filter is given by the following equation:

$$f_c = \frac{1}{2\pi C_{32} R_{32}} \quad (13)$$

As shown in FIG. 16A, the frequency response is decreased at a rate of 6 dB/oct in a low-frequency range.

Figure 16B:
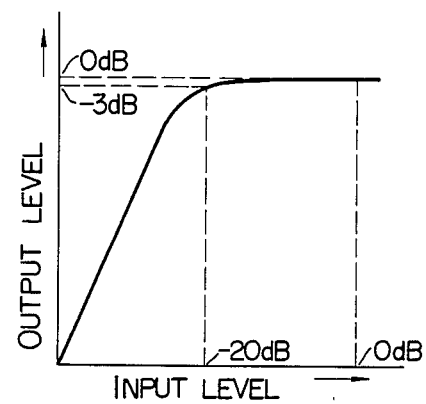

FIG. 16B shows an input-output characteristic of the combination of the differential amplifier and the amplitude limiter. As shown in FIG. 16B, when the input level exceeds $-20$ dB, the diode-connected transistors $Q_{36}$ and $Q_{37}$ are put in the ON-state, and therefore the amplitude of output is kept constant.

Figure 16C:
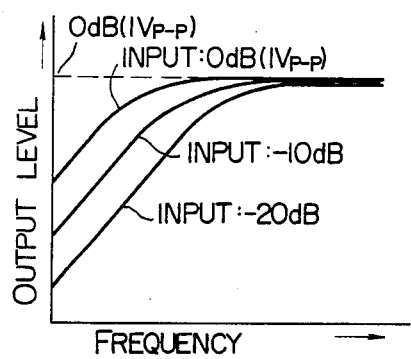

FIG. 16C shows an overall frequency characteristic of the high-pass filter, differential amplifier and amplitude limiter, using input level as parameter. Referring to FIG. 16C, in a high frequency range, the output level is kept constant, even if the input level is decreased by 20 dB.

Figure 16D:
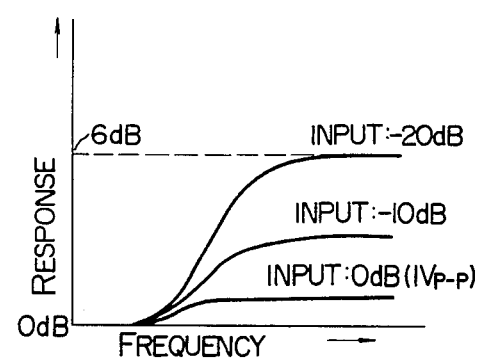

FIG. 16D shows a characteristic obtained when the output of the amplitude limiter (namely, a high-frequency component emphasis circuit) is added to an original signal. In the high frequency range, since the output of the amplitude limiter is kept constant, the ratio (the addition ratio) of the output of the amplitude limiter to the original signal is large as the input level is lower. That is, the original signal is emphasized as the input level is lower. When the amplitude of the original signal obtained at the emitter of the buffer transistor $Q_{37}$ and the amplitude of the output of the amplitude limiter obtained at the emitter of the buffer transistor $Q_{38}$ are expressed by $V_i$ and $V_c$, respectively, that ratio of the signal from the amplitude limiter to the original signal which is obtained at the output terminal 35, is given by $(V_c R_{38}):(V_i R_{40})$. When the above ratio is equal to 1, the output is twice as large as the input, that is, the original signal is emphasized by 6 dB.

When both the signal amplitude of 0 dB and the limiting voltage $V_{max}$ of the amplitude limiter are made equal to 1 $V_{p-p}$, the resistance ratio $R_{40}/R_{38}$ has to be equal to 10:1 in order to emphasize the input of having a level of $-20$ dB by 6 dB. In this case, the addition ratio for the input of 0 dB is equal to 1:10. That is, the original signal is predominant, and thus is little emphasized. As is apparent from the foregoing explanation, the circuit shown in FIG. 15 acts as a non-linear emphasis circuit.

The frequency characteristic of the high-pass filter given by equation (12) is determined by the resistance of the resistor $R_{32}$ provided in the IC 36 and the capacitance of the capacitor $C_{32}$. When the cutoff frequency of the high-pass filter varies, the characteristic of the non-linear emphasis circuit is changed. The capacitance of a capacitor provided in IC fluctuates widely, that is, in the order of above $\pm 20\%$. Accordingly, the capacitor $C_{32}$ must be formed of an external capacitor having high accuracy, as shown in FIG. 15. On the other hand, the resistance of an ordinary base-diffused resistor varies in the order of above $\pm 15\%$. Such variations in resistance cannot be neglected. However, the resistance of an ion-implanted resistor varies in a narrower range, which is one-third of the above-mentioned range. Accordingly, the resistor $R_{32}$ provided in the IC 36 for determining a time constant is formed of an ion-implanted resistor. Variations in the resistance of the ion-implanted resistor offer no serious problem.

The base current of the transistor $Q_{33}$ flows through the resistor $R_{31}$, and the base current of the transistor $Q_{34}$ flows through the resistor $R_{32}$. Accordingly, in order to make the difference between the base voltage of the transistor $Q_{33}$ and that of the transistor $Q_{34}$ equal to zero, the resistors $R_{31}$ and $R_{32}$ are required to have the same resistance. Since variations in the resistance of ion-implanted resistor and variations in the resistance of base-diffused resistor are independent of each other, the ratio of the resistance of an ion-implanted resistor to the resistance of a base-diffused resistor fluctuates widely. Accordingly, when the resistor $R_{32}$ for determining a time constant is formed of an ion-implanted resistor, the resistor $R_{31}$ is required to be formed of an ion-implanted resistor.

Figure 17:
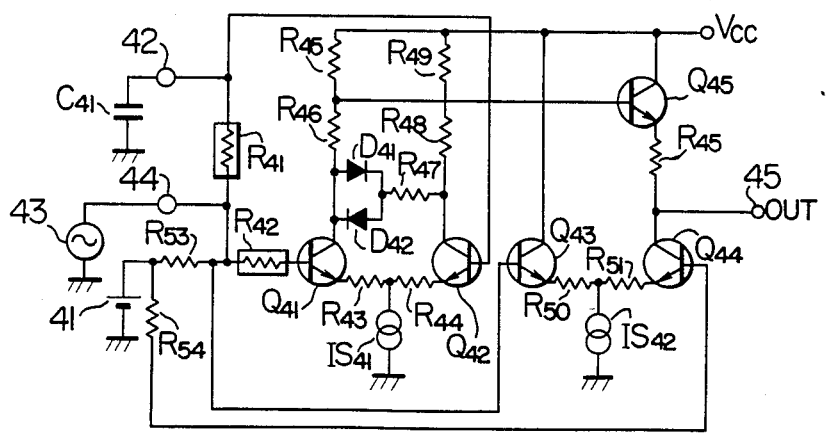
FIG. 17 is a circuit diagram showing an embodiment of a dynamic de-emphasis circuit according to the present invention.
Figure 18A:
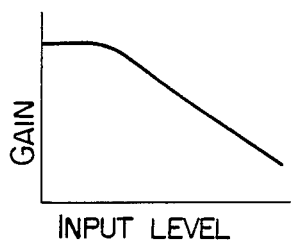
FIGS. 18A to 18C are characteristic diagrams for explaining the operation of the embodiment shown in FIG. 17.
Figure 18B:
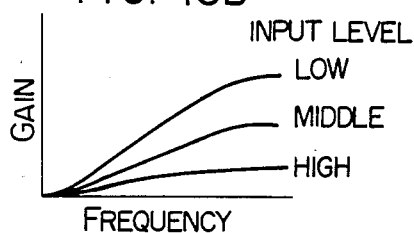
Figure 18C:
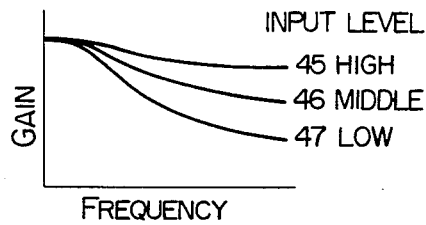

FIG. 17 shows an embodiment of a dynamic de-emphasis IC for video tape recorder according to the present invention. The circuit configuration shown in FIG. 17 has been heretofore formed of a discrete circuit. The dynamic de-emphasis circuit has such a characteristic as shown in FIG. 18C. That is, the gain versus frequency characteristic varies with an input level.

The operation of the dynamic de-emphasis circuit will be explained below, with reference to FIGS. 17 and 18A to 18C.

Referring to FIG. 17, an amplifier which is made up of transistors $Q_{41}$ and $Q_{42}$, diodes $D_{41}$ and $D_{42}$, a constant-current supply source $IS_{41}$, and resistors $R_{43}$ to $R_{49}$, includes as the load such non-linear elements as the diodes $D_{41}$ and $D_{42}$, and therefore the gain of the amplifier varies with an input level. That is, when the input level is high, the conduction resistance of each diode is decreased and thus the gain is lowered. Inversely, when the input level is low, the gain, is enhanced. A relation between the input level and the gain of the amplifier (hereinafter referred to as "compressor") is qualitatively shown in FIG. 18A. An ion-implanted resistor $R_{41}$ and a discrete capacitor $C_{41}$ connected thereto through an external terminal 42 form a low-pass filter. Thus, the differential input signal of the compressor has a high-pass filter characteristic. Accordingly, the compressor has an output characteristic as shown in FIG. 18B. The output of the compressor is added to an input signal from an input signal source 43 by an amplifier (hereinafter referred to as "adder"), which is made up of transistors $Q_{43}$, $Q_{44}$ and $Q_{45}$, a constant-current supply source $IS_{42}$, and resistors $R_{50}$ to $R_{52}$. However, since the output of the compressor is 180° out of phase with the input signal, a subtraction is performed by the adder. Accordingly, the output of the adder has a characteristic as shown in FIG. 18C. Incidentally the resistors $R_{45}$ and $R_{46}$ form an attenuator.

A feature of the embodiment of FIG. 17 resides in that variations in the dynamic de-emphasis characteristic have been suppressed by providing only one external terminal (or one pin) additionally. In more detail, when the ion-implanted resistor $R_{41}$ is replaced by a base-diffused resistor, the cutoff frequency shown in FIG. 18C varies widely, since the resistance of base-diffused resistor fluctuates in a wide range. Further, when a discrete resistor is employed instead of the ion-implanted resistor $R_{41}$, variations in resistance can be suppressed but two external terminals connected to both ends of the discrete resistor are required. That is, the number of external terminals is increased. When the capacitor $C_{41}$ is included in the IC, the number of external terminals is decreased, but the circuit characteristic varies widely since the capacitance of the bult-in capacitor varies in a wide range. As is apparent from the above explanation, the embodiment of FIG. 17 can provide a dynamic de-emphasis circuit which has a relatively uniform characteristic and requires a relatively small number of external terminals (that is, three terminals 42, 44 and 45).

Figure 20A:
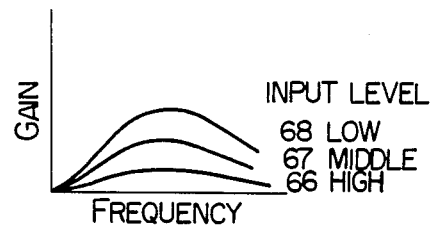
FIGS. 20A and 20B are characteristic diagrams for explaining the operation of the embodiment shown in FIG. 19.
Figure 20B:
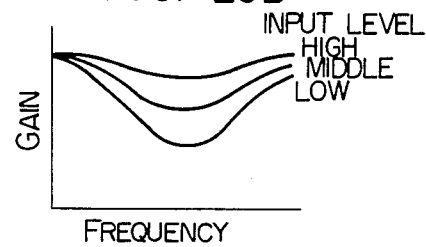
Figure 19:
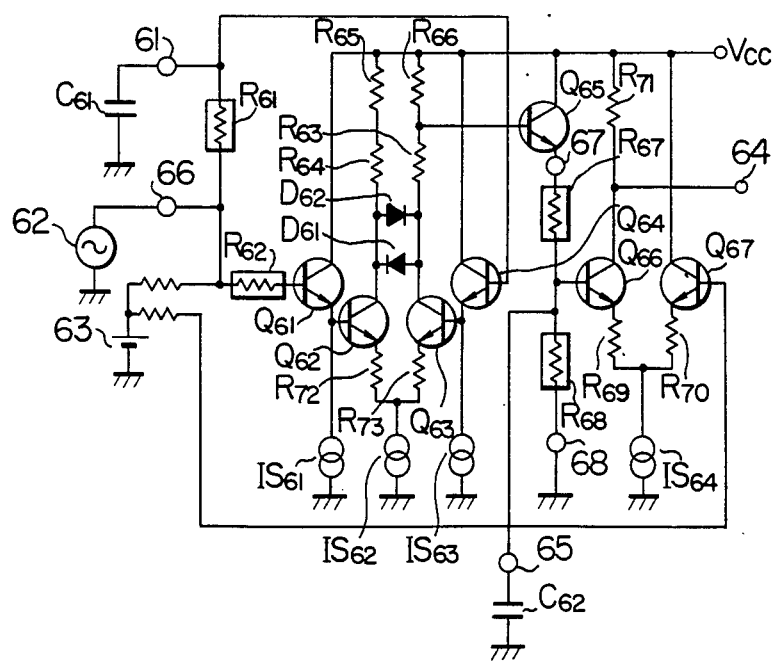
FIG. 19 is a circuit diagram showing an embodiment of a noise suppression circuit according to the present invention.

FIG. 19 shows an embodiment of a noise suppression IC according to the present invention. An IC similar to this embodiment has been manufactured by the present assignee (Model HA11703 IC). The operation of the noise suppression circuit is similar to that of the above dynamic de-emphasis circuit, if the influences of a low-pass filter provided between a compressor and a subtracter are excluded. The embodiment of FIG. 19 has a characteristic as shown in FIG. 20B. That is, the gain of the circuit is decreased in an intermediate frequency range, and moreover the degree of decrease depends upon input level. Such a characteristic is required for the reasons that the level of a noise component is low, and an intermediate frequency component is visually conspicuous when reproduced on the screen of CRT.

Now, explanation will be made of the operation of the embodiment shown in FIG. 19, with reference to FIGS. 18A, 18B, 19, 20A and 20B.

Referring to FIG. 19, transistors $Q_{61}$ and $Q_{64}$, diodes $D_{61}$ and $D_{62}$, constant-current supply sources $IS_{61}$ to $IS_{63}$, and resistors $R_{63}$ to $R_{66}$, $R_{72}$ and $R_{73}$ make up a compressor. Further, a transistor $Q_{65}$, ion-implanted resistors $R_{67}$ and $R_{68}$, and a discrete capacitor $C_{62}$ (connected to these resistors $R_{67}$ and $R_{68}$ through an external terminal 65) form a low-pass filter. Furthermore, transistors $Q_{66}$ and $Q_{67}$, a constant-current supply source $IS_{64}$, and resistors $R_{69}$ to $R_{71}$ make up a subtracter. The compressor has such an input-level versus gain characteric as shown in FIG. 18A, and the differential input signal of the compressor has a high-pass filter characteristic, as in the above-mentioned dynamic de-emphasis circuit. The output of the compressor has a characteristic as shown in FIG. 18B. The output of the compressor is applied to the low-pass filter which includes the transistor $Q_{65}$, ion-implanted resistors $R_{67}$ and $R_{68}$, and discrete capacitor $C_{62}$. When the time constant of this low-pass filter is made smaller than that of a low-pass filter made up of an ion-implanted resistor $R_{61}$ and a discrete capacitor $C_{61}$, the output of the former low-pass filter has a gain versus frequency characteristic as shown in FIG. 20A. The gain is decreased in a high-frequency range. The output of the low-pass filter is subtracted from an original signal by the subtracter. The output of the subtracter, which appears on an output terminal 64, has a characteristic shown in FIG. 20B.

A main feature of the embodiment of FIG. 19 resides in that such a noise suppression characteristic as shown in FIG. 20B can be obtained only by providing two external terminals (or pins) additionally. In more detail, if the ion-implanted resistors are replaced by base-diffused resistors, the frequency characteristic of the circuit shown in FIG. 19 will vary widely. When a discrete resistor, the resistance of which is relatively uniform, is employed instead of each of the ion-implanted resistors, a large number of external terminals are required. For example, when each of the resistors $R_{67}$ and $R_{68}$ is formed of a discrete resistor, two pins 67 and 68 are additionally required. The number of pins is increased by two.

As explained above, the embodiment shown in FIG. 19 provides a noise suppression circuit which has a relatively uniform characteristic and requires a relatively small number of external terminals.

We claim:

1. An analog amplifier integrated circuit having base process resistors which are formed simultaneously with bases of transistors by a transistor-base forming process and having ion-implanted resistors formed by an ion-implanting process different from said transistor-base forming process on a single semiconductor substrate, comprising:
   (a) a first transistor having a base and a collector connected with each other;
   (b) a first base-process resistor connected between the emitter of said first transistor and a first power supply terminal;
   (c) a second transistor having a base supplied with a potential substantially equal to the base potential of said first transistor;
   (d) a second base-process resistor connected between the emitter of said second transistor and said first power supply terminal;
   (e) a first ion-implanted resistor coupled between the collector of said first transistor and a second power supply terminal and for determining the emitter current of said first transistor;
   (f) a second ion-implanted resistor coupled between the collector of said second transistor and said second power supply terminal so that at least part of the collector current of said second transistor passes through said second ion-implanted resistor;
   (g) third and fourth transistors whose emitters are connected in common to constitute a differential amplifier, the commonly connected emitters of said third and fourth transistors being connected to the collector of said second transistor, said second ion-implanted resistor being connected between the collector of said third transistor and said second power supply terminal, the bases of said third and fourth transistors being supplied with input signals and the juncture between said second ion-implanted resistor and the collector of said third transistor providing an output signal;
   wherein said first and second ion-implanted resistors have resistances considerably greater than those of said first and second base-process resistors, respectively, and the sheet resistance of the ion-implanted resistor is larger than that of the base-process resistor and further wherein said first and second ion-implanted resistors are formed as ion-implanted resistors to provide only a small dispersion in the resistance ratio of the first and second ion-implanted resistors at the collectors of said first and second transistors, and the first and second base-process resistors are formed as base-process resistors to provide only a small dispersion in the resistance ratio of the first and second base-process resistors at the emitters of said first and second transistors to suppress the differential amplifiers gain dispersion and the d.c. operating voltage dispersion of said second transistor.

2. An analog amplifier integrated circuit according to claim 1, wherein the commonly connected emitters of the third and fourth transistors are directly connected to one another and to the collector of said second transistor without a resistor being interposed between said commonly connected emitters of the third and fourth transistors and said collector of said second transistor.

3. An analog amplifier integrated circuit according to claim 1, wherein said first and second base-process resistors have substantially the same resistance value.

4. An analog amplifier integrated circuit according to claim 1, wherein the sheet-resistance of said ion-implanted resistors is between three to ten times greater than the sheet-resistance of said said base-process resistors.

5. An analog amplifier integrated circuit according to claim 1, wherein the emitters of the third and fourth transistors are directly connected to one another without a resistor being interposed between the respective emitters.

6. An analog amplifier integrated circuit formed in a single semiconductor substrate, comprising:
   (a) a first transistor having a base and a collector connected with each other;
   (b) a first resistor connected between the emitter of said first transistor and a first power supply terminal;
   (c) a second transistor having a base supplied with a potential substantially equal to the base potential of said first transistor;
   (d) a second resistor connected between the emitter of said second transistor and said first power supply terminal;
   (e) a third resistor coupled between the collector of said first transistor and a second power supply terminal and for determining the emitter current of said first transistor; and
   (f) a fourth resistor coupled between the collector of said second transistor and said second power supply terminal so that at least part of the collector current of said second transistor passes through said fourth resistor;
   wherein said analog amplifier integrated circuit further comprises third and fourth transistors whose emitters are connected in common to constitute a differential amplifier, the commonly connected emitters of said third and fourth transistors being connected to the collector of said second transistor, said fourth resistor being connected between the collector of said third transistor and said second power supply terminal, the bases of said third and fourth transistors being supplied with input signals and the juncture between said fourth resistor and the collector of said third transistor providing an output signal, wherein a gain of said differential amplifier is dependent upon a ratio of the resistance of said first and second resistors to one another and upon a ratio of the resistance of said third and fourth resistors to one another, and further wherein, in order to maintain a small variation of said gain of said differential amplifier, said first and second resistors are simultaneously formed with the base diffusion process of said transistors to be base-process resistors so that variations in the ratio of resistances of said first and second resistors to one another are small, and said third and fourth resistors are formed as ion-implanted resistors formed by an ion-implanting process different from said transistor base diffusion process so that variations in the ratio of resistances of said third and fourth resistors to one another are small.

7. An analog amplifier integrated circuit according to claim 6, wherein the commonly connected emitters of the third and fourth transistors are directly connected to one another and to the collector of said second transistor without a resistor being interposed between said commonly connected emitters of the third and fourth transistors and said collector of said second transistor.

8. An analog amplifier integrated circuit according to claim 6, wherein said first and second base-process resistors have substantially the same resistance value.

9. An analog amplifier integrated circuit according to claim 6, wherein the values of said first, second, third and fourth resistors are set to maintain a variation of the gain of said differential amplifier to a value of substantially 10% or less.

10. An analog amplifier integrated circuit according to claim 6, wherein the sheet-resistance of said ion-implanted resistors in between three to ten times greater than the sheet-resistance of said base-process resistors.

11. An analog amplifier integrated circuit according to claim 6, wherein the emitters of the third and fourth transistors are directly connected to one another without a resistor being interposed between the respective emitters.

12. An analog amplifier integrated circuit formed in a substrate comprising:
   first and second transistors the emitters of which are connected through base-process resistors to constitute a differential amplifier;
   a bias supply circuit including at least a first base-process resistor, a third transistor whose base and collector are connected to each other and which has its collector coupled to said first base-process resistor and a second base-process resistor connected in series to the emitter of said third transistor;
   a constant current circuit including a fourth transistor connected with a base-process emitter resistor and having a base connected with the base of said third transistor to be supplied with the base potential of the third transistor, said constant current circuit being arranged so that a collector current of the fourth transistor serves as an emitter current of said differential amplifier;
   the collectors of the first and second transistors being connected with base-process load resistors;
   a constant voltage source provided in the semiconductor substrate;
   a first ion-implanted resistor through which a bias voltage is supplied to the base of said first transistor from said constant voltage source;
   a second ion-implanted resistor through which a bias voltage is supplied to the base of said second transistor from said constant voltage source, said first and second ion-implanted resistor being substantially equal in resistance value; and an external terminal provided between said second ion-implanted resistor and the base of said second transistor for applying an input signal;

wherein said first and second ion-implanted resistors have resistances considerably greater than those of the base-process resistors of said circuit and the sheet resistance of the ion-implanted resistors is larger than that of the base-process resistors and further wherein the respective resistors are formed as ion-implanted resistors or base-process resistors to suppress the differential amplifier gain dispersion and the d.c. operating voltage dispersion of said fourth transistor.

13. An analog amplifier integrated circuit formed in a semiconductor substrate comprising:

first and second transistors whose emitters are connected to each other through base-process resistors to constitute a differential amplifier;

a bias supply circuit including at least a first base-process resistor, a third transistor whose base and collector are connected to each other and which has its collector coupled to said first base process resistor and a second base-process resistor connected in series with the emitter of said third transistor;

a constant current circuit including a fourth transistor and a base-process emitter resistor connected to the emitter thereof, the base potential of said third transistor being applied to the base of said fourth transistor;

a collector current of said constant current circuit being coupled as an emitter current of said first and second transistors;

base-process load resistors connected with collectors of said first and second transistors;

an emitter follower including a fifth transistor having a base supplied with an input signal; and a signal derived from the emitter of said fifth transistor being applied to the base of said first transistor through at least a first ion-implanted resistor, and being applied to the base of said second transistor through at least a second ion-implanted resistor, a capacitor being connected between a connection between the base of said second transistor and said second ion-implanted resistor and a power supply terminal, wherein said first and second ion-implanted resistors have resistances considerably greater than those of the base-process resistors of said circuit, and the sheet resistance of the ion-implanted resistors is larger than that of the base-process resistors and further wherein the respective resistors are formed as ion-implanted resistors or base-process resistors to suppress the differential amplifier gain dispersion and the d.c. operating voltage dispersion of said fourth transistor.

* * * * *